(12) United States Patent
Van De Logt et al.

(10) Patent No.: US 7,506,227 B2
(45) Date of Patent: Mar. 17, 2009

(54) INTEGRATED CIRCUIT WITH EMBEDDED IDENTIFICATION CODE

(75) Inventors: Leon Maria Albertus Van De Logt, Eindhoven (NL); Franciscus Gerardus Maria De Jong, Eindhoven (NL)

(73) Assignee: NXP B.V., Eindhoven (NL)

( * ) Notice: Subject to any disclaimer, the term of this patent is extended or adjusted under 35 U.S.C. 154(b) by 808 days.

(21) Appl. No.: 10/525,598

(22) PCT Filed: Jul. 31, 2003

(86) PCT No.: PCT/IB03/03387

§ 371 (c)(1),
(2), (4) Date: Feb. 25, 2005

(87) PCT Pub. No.: WO2004/021022

PCT Pub. Date: Mar. 11, 2004

(65) Prior Publication Data

US 2006/0152395 A1    Jul. 13, 2006

(30) Foreign Application Priority Data

Aug. 30, 2002   (EP)   ................... 02078568

(51) Int. Cl.
*G01R 31/28* (2006.01)
(52) U.S. Cl. ..................................... 714/724
(58) Field of Classification Search ............... None
See application file for complete search history.

(56) References Cited

U.S. PATENT DOCUMENTS

| 6,271,700 B1 * | 8/2001 | Itaya ........................... 327/202 |
| 6,971,045 B1 * | 11/2005 | Deb et al. ...................... 714/30 |
| 2003/0070128 A1 * | 4/2003 | Akasaka et al. ............. 714/726 |

\* cited by examiner

*Primary Examiner*—Christine T Tu
(74) *Attorney, Agent, or Firm*—Peter Zawilski

(57) ABSTRACT

An integrated circuit (100) has a plurality of inputs (110) and a plurality of outputs (120). In a test mode, a test arrangement including a plurality of logic gates (140) is coupled between the plurality of inputs (110) and the plurality of outputs (120). The logic gates from the plurality of logic gates (140) have a first input coupled to an input of the plurality of inputs (110) and a further input coupled to a fixed logic value source (150). The fixed logic value source (150) is used to define an identification code of the integrated circuit (100), which can be retrieved at the plurality of outputs (120) when an appropriate bit pattern is fed to the plurality of inputs (110).

19 Claims, 2 Drawing Sheets

US 7,506,227 B2

INTEGRATED CIRCUIT WITH EMBEDDED IDENTIFICATION CODE

The present invention relates to an integrated circuit, comprising a plurality of inputs; a plurality of outputs; and a test arrangement being coupled between the plurality of inputs and the plurality of outputs in a test mode of the integrated circuit, the test arrangement comprising a plurality of logic gates, each logic gate from the plurality of logic gates having a first input coupled to an input from the plurality of inputs.

For various reasons, it can be advantageous to include identification information in a semiconductor device, e.g., an integrated circuit (IC), for instance because the presence of such information may provide the user of the device with direct information about the version of the electronic device. This is particularly useful when the device is integrated in a larger system, e.g., a printed circuit board or a multi-chip module, especially if the various parts of the larger system have different origins. Access to the identification information is typically required during testing of the device, for instance because the identification code may help to clarify the encounter of unexpected behavior of the device.

For this reason, the IEEE 1149.1 standard, i.e., Boundary Scan Test (BST), has included an optional identification register in the IEEE 1149.1 test architecture, which can be accessed by loading a dedicated instruction into the test architecture. However, for some semiconductor devices, e.g., memory devices, the price pressure in the market prohibits the inclusion of a BST architecture in the devices.

European patent application EP 0979418-A1 discloses an IC according to the opening paragraph. A plurality of logic gates, i.e., XOR or XNOR gates, is used to implement a test function for the interconnects between the inputs of the IC and a further IC, with the test result being observable at the outputs of the IC. However, the test mode of the integrated circuit does not provide the option to extract an identification code from the IC in the test mode, which is a disadvantage.

It is an object of the present invention to provide an IC of the opening paragraph that includes the option to extract an identification code from the IC in a test mode.

Now, the object is realized by each logic gate from the plurality of gates having a further input coupled to a fixed logic value source. The connection of an input of a logic gate to a fixed logic value source, e.g., a pull-up or a pull-down transistor or a device storing a logic value, enables the extraction of an identification code from the plurality of logic gates when an appropriate test pattern is provided to the plurality of inputs, because the output signals of the respective logic gates are governed by the logic value provided by the logic value source. The plurality of logic gates may be solely arranged to provide the identification code during the test mode of the IC, or may form a part of a larger test arrangement for a structural or functional test of the IC.

Advantageously, the IC further comprises a functional block being coupled between the plurality of inputs and the plurality of outputs in a functional mode of the integrated circuit. This ensures that the inputs will be connected to a further device if the IC is integrated in a larger system, which means that the identification code is also retrievable once the IC is integrated in such a system.

Preferably, the plurality of logic gates comprises exclusive logic gates. The use of exclusive logic gates, i.e., XOR gates or XNOR gates, has the advantage that the logic gates still distinguish between the different bit values that can be received via their first inputs, in contrast to for example an AND gate with a second input tied to a logic '0' or an OR gate with a second input tied to a logic '1', which will output a '0' and a '1' respectively regardless of the bit value on their first input. Therefore, the use of exclusive logic gates ensures that the bit patterns provided to the plurality of inputs can still be used for testing the IC.

It is an advantage if the fixed logic value source is programmable. A programmable fixed logic value source, e.g., a small memory device or an arrangement with programmable fuses, allows for versioning of the ID code, which simplifies the redesign of the IC. It also enables the inclusion of IC specific information, like a batch ID or a serial number.

It is another advantage if the integrated circuit further comprises a plurality of multiplexers, a multiplexer from the plurality of multiplexers being responsive to a select signal, the multiplexer having a first input coupled to an input from the plurality of inputs, a second input coupled to the fixed logic value source of a logic gate from the plurality of logic gates and an output coupled to the second input of the logic gate. Such a multiplexer, which can be controlled by the test controller or via a dedicated input from the plurality of inputs, i.e., by an external signal, enables the selection of the identification code generation. This can be advantageous in arrangements where the plurality of logic gates have a dual function, e.g., an IC test function when the multiplexer is switched to the input from the plurality of inputs and an identification code generation function when the multiplexer is switched to the fixed logic value source. Advantageously, the multiplexer may have further inputs connected to further fixed logic value sources that may be programmable, which enables the retrieval of more than one piece of information about the IC.

The invention is described in more detail and by way of non-limiting examples with reference to the accompanying drawings, wherein.

Figure 1:
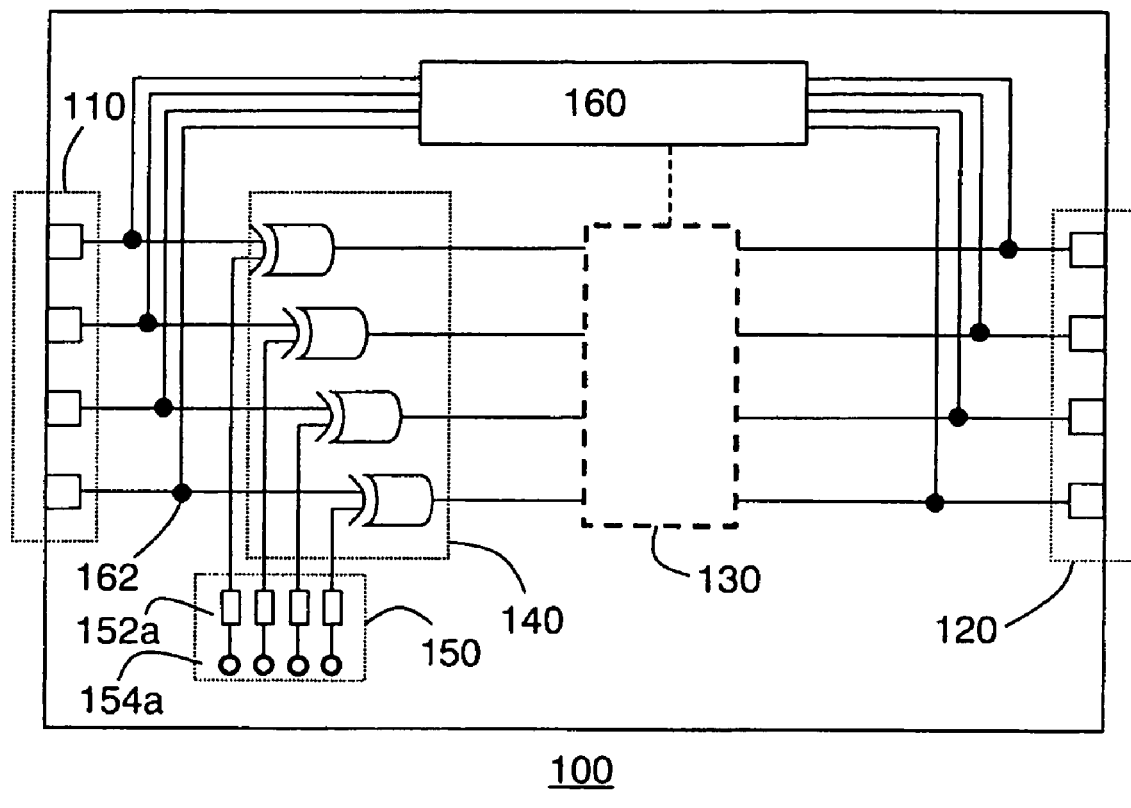
FIG. 1 depicts an embodiment of an IC according to the present invention.

In FIG. 1, IC 100 has a plurality of inputs 110 and a plurality of outputs 120. A test arrangement including a plurality of logic gates 140 is coupled between the plurality of inputs 110 and the plurality of outputs 120 in a test mode of the IC 100. The test arrangement may further comprise further test circuitry 130, which may be a test controller, a further plurality of logic gates or other test hardware, in which case the outputs of the plurality of logic gates 140 may be coupled to the plurality of outputs 120 via the further test circuitry 130. However, the presence of further test circuitry 130 is not required.

The plurality of logic gates 140 have a first input coupled to an input from the plurality of inputs 110 and a further input coupled to a fixed logic value source 150 for providing a static logic value to the second input of the logic gates from the plurality of logic gates 120. The static logic value is used to define an identification code of the IC 100 as a response to the feeding of a predefined bit pattern to the first inputs of the plurality of logic gates 140. Preferably, the plurality of logic gates 140 includes exclusive logic gates, e.g., XOR gates or XNOR gates. Exclusive logic gates have the advantage that regardless of the fixed value on their further input, their output signals still allow for making a distinction between the various input values on the first input. For instance, a XOR gate with a further input tied to a logic '1' will output a logic '1' in response to a logic '0' on its first input, and will output a logic '0' in response to a logic '1' on its first input. This is especially important when the output signals are being used for further testing, because the behavior of the exclusive logic gates ensures that the full test function space is still accessible; i.e., all possible test patterns can still be generated on the outputs of the exclusive logic gates. Such a test pattern may be a test input or a test result, depending on whether further test circuitry 130 is involved in the testing of IC 100, or the plurality of logic gates 140 is involved in the testing of the IC 100 other than generating the identification code.

However, it is emphasized that when the retrieval of an identification code from the test arrangement is the main function of the test arrangement, the use of logic gates other than exclusive logic gates becomes equally feasible, because the loss of accessibility of the full test access space is no longer an important disadvantage.

The identification code may be retrieved by feeding an appropriate bit pattern to the first inputs of the plurality of logic gates 150 via the plurality of inputs 110 of IC 100. This may be an all logic '1' bit pattern for a plurality of XNOR gates, which will force the output of the static logic values on the further inputs, or an all logic '0' bit pattern for getting the same effect in case of a plurality of XOR gates. Obviously, the inverse of the bit patterns is equally feasible, as are other bit patterns, although the use of other bit patterns than the all '1' or all '0' patterns may have the drawback that they correspond to test patterns for testing other functionality of the IC 100.

In case of the presence of further test circuitry 130 implementing a further test function $f$, the identification code may be implemented in fixed logic value source 150 in a modified form y to ensure that the processing of the bit pattern y by function $f$ yields the desired identification code x, i.e., $f(y) = x$. Alternatively, IC 100 may comprise a bypass route around further test circuitry 130 to avoid the modification of the output signals of the plurality of logic gates 140 by further test circuitry 130. The bypass route may be connected to the same outputs, i.e., the plurality of outputs 120, as the further test circuitry 130, or the bypass route may be connected to the plurality of outputs 120 with the outputs, or output, of further test circuitry 130 being coupled to a further plurality of outputs, or a single further output.

In FIG. 1, the fixed logic value source 150 includes a plurality of subsources, e.g., a pull-up or pull-down transistor 152a coupled to a voltage source 154a, each subsource being arranged to provide the second input of at least one logic gate from the plurality of logic gates 140 with a fixed logic value, i.e., a logic '0' or a logic '1'. However, other embodiments of the subsources and fixed logic value source 150 can be thought of without departing from the scope of the present invention. For instance, each subsource may include a plurality of fuses coupled to the supply voltage and the ground respectively, which may be selectively blown during implementation of the identification code. Those skilled in the art will understand that other well-known techniques to generate a fixed logic value may also be used without departing from the scope of the invention. Alternatively, fixed logic value source 150 may include a data storage device, e.g., a ROM, EPROM, EEPROM or a flash memory or other devices with non-volatile properties, for storing the fixed logic values in a form of a bit pattern representing the identification code, with the subsources being the locations containing the individual bits. A data storage device has the advantage that for a new version of the IC with an associated new identification code, the code only has to be stored in the data storage device rather than having to redesign the couplings of the second inputs of the plurality of logic gates 140, which makes the implementation of the identification code more facile.

Preferably, a functional block 160 is coupled to the same plurality of inputs 110 as the first inputs of the plurality of logic gates 120, because this ensures that the plurality of inputs 110 will be connected if the IC 100 is integrated in a larger electronic device. Functional block 160 will be coupled to the plurality of input nodes 110 in a normal mode of the IC 100. To ensure that the IC 100 is connected to the test arrangement in a test mode and to functional block 160 in a normal mode, a configurable switch 162 may be placed between an input from the plurality of inputs 110 and the connection to functional block 160 and the first input of the logic gate from the plurality of logic gates 140 respectively. The programmable switch may be any switch known from the art for switching between a test mode and a normal mode of an IC.

Figure 2:
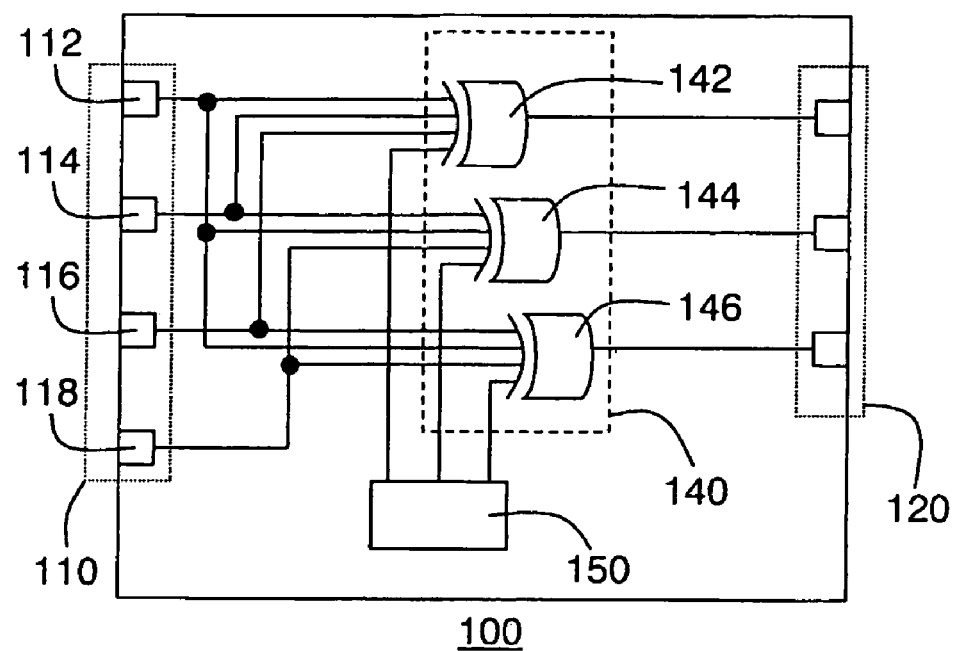
FIG. 2 depicts a part of an IC according to another embodiment of the present invention.

The following FIGS. are described in back reference to FIG. 1 and its detailed description. Corresponding reference numerals will have similar meanings unless explicitly stated otherwise. In FIG. 2, the plurality of logic gates 140 have a plurality of inputs coupled to a plurality of inputs and their further input coupled to fixed logic value source 150. It is emphasized that optional further control circuitry 130 and logic block 160 have been omitted from FIG. 2 for reasons of clarity only. Exclusive logic gate 142 has respective inputs coupled to inputs 112, 114 and 116; exclusive logic gate 144 has respective inputs coupled to inputs 112, 114 and 118 and exclusive logic gate 144 has respective inputs coupled to inputs 112, 116 and 118. This arrangement is known from European patent application EP 0979418-A1, where it is described as an alternative to BST for testing the interconnects of IC 100. As previously explained, the Boolean function implemented by an exclusive logic gate allows for the extension of the logic gate with an input tied to a fixed logic value without losing functional coverage. Therefore, the logic gates from the plurality of logic gates 140, e.g., exclusive logic gates 142, 144 and 146 have a further input coupled to a fixed logic value 150. This way, the interconnects, e.g., the plurality of inputs 110, of IC 100 can still be tested, while an identification code of IC 100 can be extracted from the IC 100 as well by providing the plurality of inputs 110 with an all logic '1' or all logic '0' bit pattern.

Figure 3:
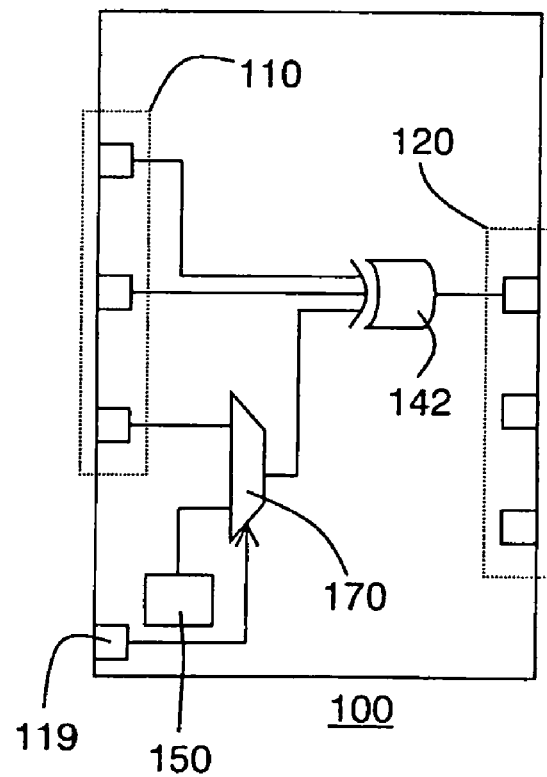
FIG. 3 depicts a part of an IC according to yet another embodiment of the present invention.

FIG. 3 shows an alternative implementation of the test arrangement of FIG. 2. In this implementation, the further input of a logic gate, e.g., exclusive logic gate 142, is shared by the fixed logic value and an input from the plurality of inputs 110. It is emphasized that only exclusive logic gate 142 is shown for mere reasons of clarity, the other logic gates from the plurality of logic gates 140 may have a similar arrangement. The input from the plurality of inputs 110 and the fixed logic value from fixed logic value source 150 are respectively coupled to a first and second input of a multiplexer 170 or a similar selection circuitry. The control terminal of multiplexer 170 may be controlled by an external source, e.g., an IC test apparatus or another IC, via dedicated input 119. Alternatively, the multiplexer may be controlled by the further test circuitry 130 shown in FIG. 1, e.g., a dedicated register for generating test control signals or a test access port (TAP) controller. The path from the fixed logic value source 150 to the further input of exclusive logic gate 142 will be selected when the identification code has to be retrieved from IC 100.

This arrangement has the advantage that no additional input is required on the logic gates from the plurality of logic gates 140. In addition, other fixed logic value sources may be added as additional inputs to multiplexer 170, which means that different information may be retrieved via multiplexer 170. This can for instance be used to store information about a location, e.g., an internet address, where to retrieve relevant data of IC 100. The relevant data may even include test patterns that can be accessed after the information is retrieved from the appropriate fixed logic value source.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit, comprising:
   a plurality of inputs;
   a plurality of outputs;
   a functional block being coupled between the plurality of inputs and the plurality of outputs only in a functional mode of the integrated circuit;
   a test arrangement being coupled between the plurality of inputs and the plurality of outputs in a test mode of the integrated circuit, the test arrangement comprising a plurality of logic gates, each logic gate from the plurality of logic gates having a first input coupled to an input from the plurality of inputs; and
   a programmable switch configured to switch between the functional mode and the test mode of the integrated circuit, wherein the programmable switch is coupled between an input from the plurality of inputs, the functional block and the first input of each logic gate from the plurality of logic gates,
   characterized by each logic gate from the plurality of gates having a further input coupled to a fixed logic value source.

2. An integrated circuit as claimed in claim 1, characterized in that the plurality of logic gates comprises exclusive logic gates.

3. An integrated circuit as claimed in claim 1, characterized in that the fixed logic value source is programmable.

4. An integrated circuit as claimed in claim 1, characterized by further comprising a plurality of multiplexers, a multiplexer from the plurality of multiplexers being responsive to a select signal, the multiplexer having a first input coupled to an input from the plurality of inputs, a second input coupled to the fixed logic value source of a logic gate from the plurality of logic gates and an output coupled to the further input of the logic gate.

5. An integrated circuit as claimed in claim 4, characterized in that the select signal is provided by the test arrangement.

6. An integrated circuit as claimed in claim 4, characterized in that the select signal is provided via a dedicated input from the plurality of inputs.

7. An integrated circuit, comprising:
   a plurality of inputs;
   a plurality of outputs;
   a test arrangement being coupled between the plurality of inputs and the plurality of outputs in a test mode of the integrated circuit, the test arrangement comprising a plurality of logic gates, each logic gate from the plurality of logic gates having a first function and a second function, each logic gate from the plurality of logic gates having a first input coupled to an input from the plurality of inputs; and
   a plurality of multiplexers, a multiplexer from the plurality of multiplexers being responsive to a select signal, the multiplexer having a first input coupled to an input from the plurality of inputs, a second input coupled to the fixed logic value source of a logic gate from the plurality of logic gates and an output coupled to the further input of the logic gate, wherein the logic gate performs the first function when the multiplexer is switched to the input from the plurality of inputs and the second function when the multiplexer is switched to the fixed logic value source of the logic gate,
   characterized by each logic gate from the plurality of gates having a further input coupled to a fixed logic value source.

8. An integrated circuit as claimed in claim 7, characterized by further comprising a functional block being coupled between the plurality of inputs and the plurality of outputs in a functional mode of the integrated circuit.

9. An integrated circuit as claimed in claim 7, characterized in that the plurality of logic gates comprises exclusive logic gates.

10. An integrated circuit as claimed in claim 7, characterized in that the fixed logic value source is programmable.

11. An integrated circuit as claimed in claim 7, characterized in that the select signal is provided by the test arrangement.

12. An integrated circuit as claimed in claim 7, characterized in that the select signal is provided via a dedicated input from the plurality of inputs.

13. An integrated circuit, comprising:
   a plurality of inputs;
   a plurality of outputs; and
   a test arrangement being coupled between the plurality of inputs and the plurality of outputs in a test mode of the integrated circuit, the test arrangement comprising a plurality of logic gates, each logic gate from the plurality of logic gates having a first input coupled to an input from the plurality of inputs;
   characterized by each logic gate from the plurality of gates having a further input coupled to a fixed logic value source, wherein the fixed logic value source includes a plurality of subsources, each subsource being arranged to provide the further input of at least one logic gate from the plurality of logic gates with a fixed logic value.

14. An integrated circuit as claimed in claim 13, characterized by further comprising a functional block being coupled between the plurality of inputs and the plurality of outputs in a functional mode of the integrated circuit.

15. An integrated circuit as claimed in claim 13, characterized in that the plurality of logic gates comprises exclusive logic gates.

16. An integrated circuit as claimed in claim 13, characterized in that the fixed logic value source is programmable.

17. An integrated circuit as claimed in claim 13, characterized by further comprising a plurality of multiplexers, a multiplexer from the plurality of multiplexers being responsive to a select signal, the multiplexer having a first input coupled to an input from the plurality of inputs, a second input coupled to the fixed logic value source of a logic gate from the plurality of logic gates and an output coupled to the further input of the logic gate.

18. An integrated circuit as claimed in claim 17, characterized in that the select signal is provided by the test arrangement.

19. An integrated circuit as claimed in claim 18, characterized in that the select signal is provided via a dedicated input from the plurality of inputs.

* * * * *